Dec. 15, 1953

JACQUES I. PANTCHECHNIKOFF
NOW BY CHANGE OF NAME
JACQUES ISAAC PANKOVE 2,662,976

SEMICONDUCTOR AMPLIFIER AND RECTIFIER

Filed March 31, 1949

INVENTOR
JACQUES I. PANTCHECHNIKOFF
BY
H. L. Newton
ATTORNEY

Patented Dec. 15, 1953 2,662,976

UNITED STATES PATENT OFFICE 2,662,976

SEMICONDUCTOR AMPLIFIER AND RECTIFIER

Jacques I. Pantchechnikoff, Princeton, N. J., now by change of name Jacques Isaac Pankove, assignor to Radio Corporation of America, a corporation of Delaware Application March 31, 1949, Serial No. 84,671

4 Claims. (Cl. 250—20)

This invention relates to semi-conductor devices and particularly to a multi-electrode semiconductor device which may be used simultaneously as an amplifier and rectifier.

In the past, many attempts have been made to construct an amplifier which does not include a vacuum tube. One of the most recent amplifiers of this type utilizes a three-electrode semi-conductor. This device, which has been termed a "transistor," has been disclosed in a series of three letters to the Physical Review by Bardeen and Brattain, Brattain and Bardeen, and Shockley and Pearson which appear on pages 230 to 233 of the July 15, 1948 issue. The new amplifier includes a block of a semi-conducting material such as silicon or germanium which is provided with two closely adjacent point electrodes called "emitter" and "collector" electrodes in contact with one surface region of the material, and a "base" electrode which provides a large-area, low-resistance contact with another surface region of the semi-conducting material. The input circuit of the amplifier described in the publication referred to above is connected between the emitter electrode and the base electrode while the output circuit is connected between the collector electrode and the base electrode. The base electrode is therefore the common input and output electrode and may be grounded.

Crystal rectifiers have been known for a considerable period of time. Such rectifiers usually have a large-area and a small-area electrode provided on a block of semi-conducting material such as a germanium or a selenium crystal. In accordance with the present invention a semi-conductor amplifier is arranged in such a manner that it may be used simultaneously as a rectifier.

It is the principal object of the present invention, therefore, to provide a semi-conductor amplifier which may be used simultaneously as a rectifier.

A further object of the invention is to provide a coherent crystal of semi-conducting material with a multiplicity of electrodes which may be connected in a circuit to provide a combined amplifier and rectifier having a common electrode.

A semi-conductor device in accordance with the present invention comprises a body of semiconducting material provided with a base electrode having a relatively large contact area with the body as well as with an emitter and a collector electrode which have small contact areas with the body. In accordance with the present invention a rectifier electrode is provided which also has a small contact area with the body of semi-conducting material. The rectifier electrode is spaced from the emitter and collector electrodes a distance which is appreciably larger than the distance between the emitter and collector electrodes so as to prevent interaction between the rectifier electrode, on the one hand, and the emitter and collector electrodes, on the other hand. The base and rectifier electrodes accordingly are adapted to operate as a rectifier while the base, emitter and collector electrodes function as an amplifier. The base electrode accordingly is common to both the rectifier and the amplifier sections of the device.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
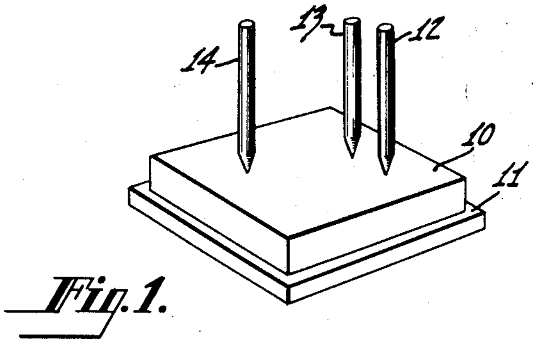
Figure 1 is a view in perspective of a semiconductor device embodying the present invention and suitable for use as a combined rectifier and amplifier.

Referring now to the drawing, in which like components have been designated by the same reference numerals throughout the figures, and particularly to Figure 1, there is illustrated a combined rectifier and amplifier device in accordance with the present invention. The device comprises a body 10 of semi-conducting material which may consist, for example, of a crystal of germanium, silicon, boron, tellurium or selenium containing a small but sufficient number of atomic impurity centers or lattice imperfections as commonly employed for crystal rectifiers. Germanium is the preferred material for body 10 and may be prepared to be an electronic N type semi-conductor. However, it is also feasible to utilize an electronic P type semi-conductor which may consist of germanium or silicon containing certain well known impurities. The surface of semi-conducting body 10 may be polished and etched in the manner explained, for example, in the recent paper by J. A. Becker and J. N. Shive which appears in the March 1949 issue of "Electrical Engineering" on pages 215 to 221. It is also feasible to utilize the germanium block from a commercial high-back-voltage germanium rectifier such as the type 1N44, in which case further surface treatment may not be required.

Semi-conductor 10 is provided with a large-area low-resistance electrode 11 serving as the base electrode of the amplifier section of the device. Semi-conductor 10 is further provided with point electrodes 12 and 13 which may be used as the emitter and collector electrode respectively of the amplifier section of the device. Semi-conductor 10 is further provided with rectifier electrode 14 in accordance with the present invention. Point electrodes 12, 13 and 14 may consist, for example, of tungsten or Phosphor bronze wires having a diameter of the order of 2 to 5 mils. Emitter and collector electrodes 12, 13 are ordinarily placed closely adjacent to each other and may be separated by a distance of from 2 to 4 mils. However, as explained in the recent article by W. E. Kock and R. L. Wallace, Jr. which appears on pages 222 to 223 of the March 1949 issue of "Electrical Engineering" the collector and emitter electrodes 12, 13 may also be arranged on opposite faces of a very thin disc of semi-conducting material.

Rectifier electrode 14 preferably has a distance of at least 20 mils from either emitter electrode 12 or collector electrode 13. The distance between rectifier electrode 14 and either electrode 12 or 13 should be such as to prevent substantial interaction between the emitter and collector electrodes, on the one hand, and the rectifier electrode, on the other hand, through conduction of current along the surface of body 10. In particular, rectifier electrode 14 should not be responsive to the charge carriers emitted by emitter electrode 12 and collector electrode 13 should not be affected by the potentials existing at rectifier electrode 14.

Accordingly, base electrode 11 and rectifier electrode 14 form together a rectifier section of the device while base electrode 11 and emitter and collector electrodes 12, 13 form the amplifier section thereof. If body 10 consists of an N type semi-conducting material which may have a P type surface layer, rectifier electrode 14 forms the anode of the rectifier section while base electrode 11 forms the cathode of the rectifier section. However, if body 10 consists of a P type semi-conducting material with an N type surface layer, rectifier electrode 14 will function as the cathode of the rectifier section while base electrode 11 is the anode of the rectifier section. For the following explanation of the clipper amplifier of Figure 2 it will be assumed that body 10 consists of an N type semi-conducting material having a P type surface layer in which case electrode 14 forms the anode of the rectifier as indicated in Figure 2.

Figure 2:
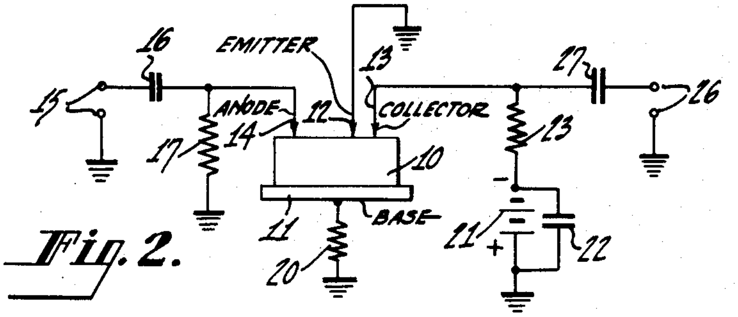
Figure 2 is a circuit diagram of a clipper amplifier utilizing the device of Figure 1 and claimed in applicant's copending application, Serial No. 84,673, filed concurrently herewith and assigned to the assignee of the present application.

Figure 2 illustrates by way of example a negative clipper amplifier utilizing the device of Figure 1. An input signal to be clipped is impressed on input terminals 15, one of which is coupled through coupling capacitor 16 to anode or rectifier electrode 14. Anode 14 is grounded through leak resistor 17. Base electrode 11 is connected to ground through bias resistor 20 which forms the coupling impedance between the rectifier and the amplifier sections of the device. Emitter electrode 12 is grounded as shown. Collector electrode 13 is connected to the negative terminal of a suitable source of voltage such as battery 21 having its positive terminal grounded. Battery 21 may be bypassed to ground for signal frequencies through bypass capacitor 22. Load resistor 23 is provided between battery 21 and collector electrode 13. The clipped and amplified output signal may be derived from output terminals 26, one of which is coupled to collector electrode 13 through coupling capacitor 27.

The operation of the amplifier section of the circuit of Figure 2 is as follows: Battery 21 impresses a bias voltage between collector electrode 13 and base electrode 11 so as to bias the two electrodes in a relatively non-conducting polarity. The amplifier section will accordingly draw current flowing from ground through resistor 20, base electrode 11, collector electrode 13, load resistor 23, and battery 21 back to ground. Since emitter electrode 12 is maintained at ground potential a bias is normally provided between emitter electrode 12 and base electrode 11 which will bias them in a relatively conducting polarity. In other words, emitter electrode 12 is held at a potential that is positive with respect to that of base electrode 11.

Figure 3:
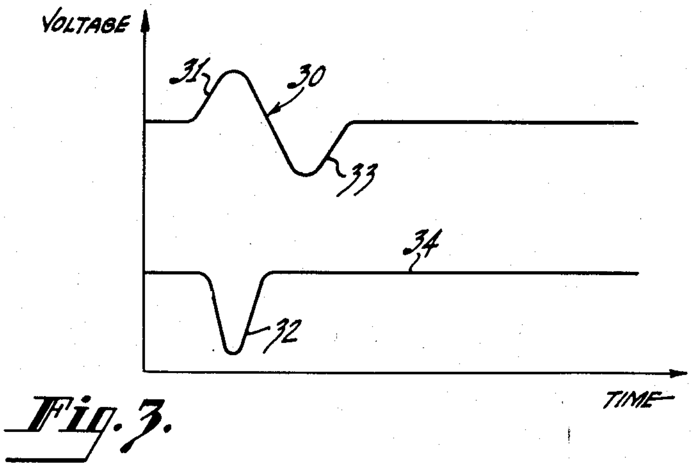
Figure 3 is a graph illustrating the input and output voltages of the clipper amplifier of Figure 2.

Let it now be assumed that a signal 30 as shown in Figure 3 is impressed on input terminals 15. The positive portion 31 of the input signal to be clipped will render anode 14 positive with respect to ground. Accordingly, a current will now flow from anode 14 to base electrode 11, resistor 20 and ground back to the input terminals 15. This will raise the potential of base electrode 11 in a positive direction thereby reducing the bias voltage between emitter electrode 12 and base electrode 11. Accordingly, the current flowing between base electrode 11 and collector electrode 13 is reduced or may even be cut off entirely so that the potential of collector electrode 13 goes negative and approaches that of battery 21. Consequently, an output signal such as shown at 32 in Figure 3 is obtained from output terminals 26. Output signal 32 is of negative polarity and is amplified in view of the amplification of the amplifier section of the device. The negative polarity of output signal 32 is due to the phase reversal of the amplifier section because the input signal is applied to the base electrode.

When the negative portion 33 of input signal 30 is impressed on input terminals 15, anode 14 is made negative. In that case, no current can pass between anode 14 and base electrode 11. Hence, the bias voltage between emitter electrode 12 and base electrode 11 is sufficient to permit the amplifier section to conduct current. The current flowing through load resistor 23 will therefore raise the potential of collector electrode 13 as shown at 34 in Figure 3.

The circuit of Figure 2 therefore functions as a negative clipper or half-wave rectifier and amplifier which clips the negative portion of an input signal. The clipped input signal is then amplified by the amplifier section of the circuit. It is to be understood that the clipper action would be reversed if body 10 consists of a P type semi-conductor in which case electrode 14 would be the cathode of the rectifier. In that case, the positive portion 31 of the input signal would be clipped and the negative portion 33 of the input signal would be amplified.

While it will be understood that the circuit specifications of the clipper amplifier of Figure 2 may vary according to the design for any particular application, the following circuit specifications are included by way of example only.

| | |
|---|---|
| Resistor 17 | 10,000 ohms. |
| Resistor 20 | 2,000 ohms. |
| Resistor 23 | 50,000 ohms. |
| Capacitor 16 | .004 microfarads. |
| Capacitor 27 | .004 microfarads. |
| Capacitor 22 | 2 microfarads. |
| Battery 21 | 67.5 volts. |

It is also to be understood that more than one rectifier electrode such as 14 may be provided in which case the device would consist of one amplifier section and two or more rectifier sections.

There has thus been disclosed a multi-electrode semi-conductor device consisting of a conventional three-electrode semi-conductor and provided with a separate point electrode cooperating with the base electrode of the amplifier section to provide a rectifier. The spacing between the rectifier electrode and the emitter and collector electrodes of the amplifier section should be sufficient to prevent undesired interaction between the rectifier section and the amplifier section of the device.

What is claimed is:

1. A semiconductor system comprising a body of semiconducting material, a first electrode having a relatively large contact area with said body, at least second, third and fourth electrodes, each having a contact area with said body that is small compared to that of said first electrode and being spaced from each other, said fourth electrode being spaced from both said second and third electrodes a distance that is so much larger than the distance between said second and third electrodes as to prevent substantially the flow of charge carriers between said fourth electrode on the one hand and said second or third electrode on the other hand, said first and fourth electrodes forming a rectifier section, said first, second, and third electrodes forming an amplifier section, a coupling impedance connected between said first and second electrodes interconnecting and in common circuit with said rectifier and amplifier sections, means for applying a signal to said rectifier section, and means for deriving an output signal from said amplifier section.

2. A semiconductor system comprising a body of semiconducting material, a first electrode having a relatively large contact area with said body, at least second, third and fourth electrodes, each having a contact area with said body that is small compared to that of said first electrode and being spaced from each other, said fourth electrode being spaced from both said second and third electrodes a distance that is so much larger than the distance between said second and third electrodes as to prevent substantially the flow of charge carriers between said fourth electrode on the one hand and said second or third electrode on the other hand, said first and fourth electrodes forming a rectifier section, said first, second, and third electrodes forming an amplifier section, a coupling impedance connected between said first and second electrodes interconnecting and in common circuit with said rectifier and amplifier sections, means connected between said fourth and second electrodes for applying a signal to said rectifier section, and means connected between said third and second electrodes for deriving an output signal from said amplifier section.

3. A semiconductor system comprising a body of semiconducting material, a base electrode having a relatively large contact area with said body, an emitter, a collector, and a rectifier electrode, each being in rectifying contact with said body, said emitter and collector electrodes being closely spaced while said rectifier electrode is spaced from both said emitter and collector electrodes such a distance as to prevent substantially direct interaction between said rectifier electrode and the flow of charge carriers between the emitter and collector, said base and rectifier electrodes forming a rectifier section, said base, emitter, and collector electrodes forming an amplifier section, a coupling impedance connected between said base and emitter electrodes interconnecting and in common circuit with said rectifier and amplifier sections, means for applying a signal to said rectifier section, and means for deriving an output signal from said amplifier section.

4. A semiconductor system comprising a body of semiconducting material, a base electrode having a relatively large contact area with said body, an emitter, a collector, and a rectifier electrode, each being in rectifying contact with said body, said emitter and collector electrodes being arranged in relatively close proximity while said rectifier electrode is spaced from both said emitter and collector electrodes such a distance as to prevent substantial direct interaction between the rectifier electrode and the charge carriers flowing between said emitter and collector electrodes through conduction thereof along the surface of said body, said rectifier and said base electrodes forming a rectifier section, said emitter, collector, and base electrodes forming an amplifier section, a coupling impedance connected between said base and emitter electrodes interconnecting and in common circuit with said rectifier and amplifier sections, said rectifier and emitter electrodes being biased in the forward direction with respect to said body, said collector electrode being biased in the reverse direction with respect to said body, means connected between said base and emitter electrodes for applying a signal to said rectifier section, and means connected between said collector and emitter electrodes for deriving an output signal from said amplifier section.

JACQUES I. PANTCHECHNIKOFF.

References Cited in the file of this patent

UNITED STATES PATENTS

| Number | Name | Date |
|---|---|---|
| 2,048,100 | Burnside | July 21, 1936 |
| 2,402,661 | Ohl | June 25, 1946 |
| 2,434,929 | Holland et al. | Jan. 27, 1948 |
| 2,476,323 | Rack | July 19, 1949 |
| 2,524,035 | Bardeen et al. | Oct. 3, 1950 |
| 2,547,386 | Gray | Apr. 3, 1951 |
| 2,553,490 | Wallace | May 15, 1951 |

OTHER REFERENCES

Physical Review, July 15, 1948, pp. 230–233. (Copy in 179–171–MB.)

Electronics, Sept. 1948, pp. 68–71. (Copy in 179–171–MB.)

"Radio Engineering" 3d Ed. Terman pp. 752–753 pub. 1947, McGraw-Hill Book Co., N. Y.